(12) United States Patent
Noro et al.

(10) Patent No.: US 6,686,622 B2
(45) Date of Patent: Feb. 3, 2004

(54) SEMICONDUCTOR MEMORY DEVICE AND MANUFACTURING METHOD THEREOF

(75) Inventors: Fumihiko Noro, Kyoto (JP); Seiki Ogura, Wappinger Falls, NY (US)

(73) Assignees: Matsushita Electric Industrial Co., Ltd., Osaka (JP); Halo LSI Design and Device Technologies Inc., Wappingers Falls, NY (US)

( * ) Notice: Subject to any disclaimer, the term of this patent is extended or adjusted under 35 U.S.C. 154(b) by 0 days.

(21) Appl. No.: 10/077,979

(22) Filed: Feb. 20, 2002

(65) Prior Publication Data

US 2003/0042533 A1 Mar. 6, 2003

(30) Foreign Application Priority Data

Aug. 31, 2001 (JP) .......................................... 2001-264027

(51) Int. Cl.[7] .............................................. H01L 29/76
(52) U.S. Cl. ......................... 257/314; 257/316; 257/317
(58) Field of Search ................................ 257/314, 330, 257/346, 316, 317; 438/201, 211, 217, 257, 259, 267

(56) References Cited

U.S. PATENT DOCUMENTS

| 5,591,652 A | * | 1/1997 | Matsushita ................... 438/259 |
| 5,780,341 A | * | 7/1998 | Ogura ........................... 438/259 |
| 5,852,312 A | * | 12/1998 | Ahn ............................. 257/321 |
| 6,051,860 A | * | 4/2000 | Odanaka et al. ............ 257/316 |

FOREIGN PATENT DOCUMENTS

JP 61-182267 8/1986

* cited by examiner

Primary Examiner—Phat X. Cao
Assistant Examiner—Theresa T. Doan
(74) Attorney, Agent, or Firm—McDermott, Will & Emery

(57) ABSTRACT

A semiconductor memory device includes a control gate electrode formed on a first main surface of a semiconductor substrate through a first insulating film, and a floating gate electrode covering a stepped region which connects the first main surface of the semiconductor substrate and a second main surface positioned at a lower level than the first main surface through a second insulating film and having a side surface capacitively coupled with one side surface of the control gate electrode through a third insulating film. The stepped region has a first stepped portion connected with the first main surface and a second stepped portion connecting the first stepped portion and the second main surface.

8 Claims, 6 Drawing Sheets

SEMICONDUCTOR MEMORY DEVICE AND MANUFACTURING METHOD THEREOF

BACKGROUND OF THE INVENTION

The present invention relates to a floating gate EEPROM (Electrically Erasable and Programmable Read Only Memory) device. The invention more particularly relates to a semiconductor memory device and a manufacturing method of the same wherein a semiconductor substrate and a floating gate electrode are opposed to each other through an insulating film and the floating gate electrode covers a stepped portion provided at the semiconductor substrate.

The EEPROM device having a floating gate electrode is well known as an electrically programmable and erasable, nonvolatile memory.

In recent years, a so-called split gate type EEPROM device has been suggested. The memory is provided with a floating gate electrode on a side surface of the control gate electrode so that the device can operate at relatively low voltage.

Meanwhile, there has been a demand for a semiconductor device such as a transistor having an extra small size, a higher integration density, and higher reliability and exhibiting high performance. This also applies to the split gate type EEPROM device.

A conventional split gate type semiconductor memory device will be now described in conjunction with the accompanying drawings.

As shown in FIG. 6A, the semiconductor substrate 101 in the conventional semiconductor memory device has a first main surface 101a, a second main surface 101b positioned at a lower level than the first main surface 101a and a stepped portion 101c connecting these surfaces. A control gate electrode 104 is formed on the first main surface 101a through a first insulating film 103 serving as a gate insulating film.

There is a floating gate electrode 106 capacitively coupled through a second insulating film 105 on a side surface of the control gate electrode 104 on the side of the stepped portion 110c and opposed to the stepped portion 101c through the second insulating film 105. The portion of the second insulating film 105 opposed to the control gate electrode 104 serves as a capacitive film, while the portion opposed to the channel region of the semiconductor substrate 101 serves as a tunnel film.

A source region 107 is formed by ion-implantation in a region included in the first main surface of the semiconductor substrate 101. A drain region 108 is formed by ion-implantation in a region included in the second main surface.

However, as in FIG. 6B, an enlarged sectional view showing the vicinity of the stepped portion 101c, in the above conventional semiconductor memory device, the direction X of the first main surface and the side surface direction Y of the stepped portion 101c makes an obtuse dip angle θ with respect to the upper side corner of the stepped portion 101c as the initial point. More specifically, the upper side corner of the stepped portion forms an acute angle and therefore the second insulating film (tunnel film) 105 is locally thinned at the corner. As a result, the second insulating film has a lowered breakdown voltage, which lowers the reliability of the memory device.

SUMMARY OF THE INVENTION

The present invention is directed to a solution to the above disadvantages associated with the conventional technique, and it is an object of the present invention to improve the reliability of a memory by preventing a tunnel film from being thinned by the presence of a stepped portion.

According to the present invention, in order to achieve the above object, a stepped region formed on a semiconductor substrate and covered by a floating gate electrode includes a plurality of stepped portions.

More specifically, a semiconductor memory device according to the present invention includes a control gate electrode formed on a first main surface of a semiconductor substrate through a first insulating film, and a floating gate electrode covering a stepped region which connects the first main surface of the semiconductor substrate and a second main surface positioned at a lower level than the first main surface through a second insulating film and having a side surface capacitively coupled with one side surface of the control gate electrode through a third insulating film. The stepped region has a first stepped portion connected with the first main surface and a second stepped portion connecting the first stepped portion and the second main surface.

In the semiconductor memory device according to the present invention, the height (depth) of each of the stepped portions is reduced, and therefore the dip angles at the corners of the stepped portions are acute. As a result, the second insulating film serving as a tunnel film covering the stepped region is not locally thinned at the corners of the stepped portions. Therefore, the breakdown voltage of the second insulating film is not lowered, and the device may have improved reliability.

Preferably, in the semiconductor memory device according to the present invention, the first and second stepped portions both have an acute dip angle, and the dip angle of the second stepped portion is larger than the dip angle of the first stepped portion.

In this case, the dip angle of the first stepped portion is preferably larger than 0° and substantially not larger than 50°.

A method of manufacturing a semiconductor memory device according to the present invention includes a first step of selectively forming a control gate electrode of a first conductive film on a first main surface of a semiconductor substrate through a first insulating film, a second step of selectively etching a region on one side of the control gate electrode at the semiconductor substrate, thereby forming a first stepped portion at an upper part of the semiconductor substrate, a third step of selectively etching a region on the opposite side of the control gate electrode with respect to the first stepped portion at the semiconductor substrate along the first stepped portion, thereby forming a second stepped portion connected to the first stepped portion and a second main surface connected to the second stepped portion at an upper part of the semiconductor substrate, a fourth step of forming a second insulating film to cover a side surface of the control gate electrode on the side of the first stepped portion, the first stepped portion, the second stepped portion, and the second main surface, a fifth step of forming a floating gate electrode of a sidewall-shaped second conductive film so that the electrode covers the side surface of the control gate electrode on the side of the first stepped portion, the first stepped portion, the second stepped portion and the second main surface through the second insulating film, and a sixth step of implanting an impurity to the semiconductor substrate using the control gate electrode and the floating gate electrode as masks, thereby forming a source region and a drain region on the first and second main surfaces, respectively.

By the method of manufacturing a semiconductor memory device according to the present invention, the second stepped portion connected to the first stepped portion and the second main surface connected to the second stepped portion are formed at an upper part of the semiconductor substrate. Therefore, if the second insulating film to be a tunnel film is subsequently formed to cover the stepped portions, the second insulating film is not locally thinned at the corners of the stepped portions. As a result, the breakdown voltage of the second insulating film is not lowered and the device may have improved reliability.

The method of manufacturing a semiconductor memory device according the present invention preferably further includes the step of implanting an impurity into a region on a side of the control gate electrode between the second step and the fifth step.

In the method of manufacturing a semiconductor memory device according the present invention, in the third step, the second stepped portion is preferably etched to a lower level than the first stepped portion.

Preferably, in the method of manufacturing a semiconductor memory device according the present invention, the first and second stepped portions both have an acute dip angle, and the dip angle of the second stepped portion is larger than the dip angle of the first stepped portion.

Furthermore, in this case, the dip angle of the first stepped portion is preferably larger than 0° and substantially not larger than 50°.

BRIEF DESCRIPTION OF THE DRAWINGS

FIG. 1A shows a section of a memory cell, and FIG. 1B shows an enlarged section of the vicinity of a stepped region of a semiconductor substrate;

FIG. 6A shows a section of a memory cell, and FIG. 6B shows an enlarged section of the vicinity of a stepped region.

DETAILED DESCRIPTION OF THE INVENTION

[First Embodiment]

A first embodiment of the present invention will be now described in conjunction with the accompanying drawings.

Figure 1A:
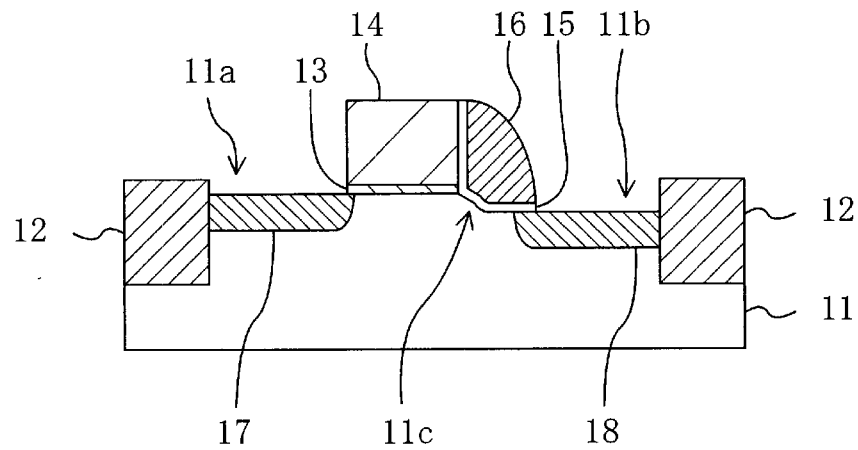
FIGS. 1A and 1B are sectional views of a semiconductor memory device according to a first embodiment of the present invention, where
Figure 1B:
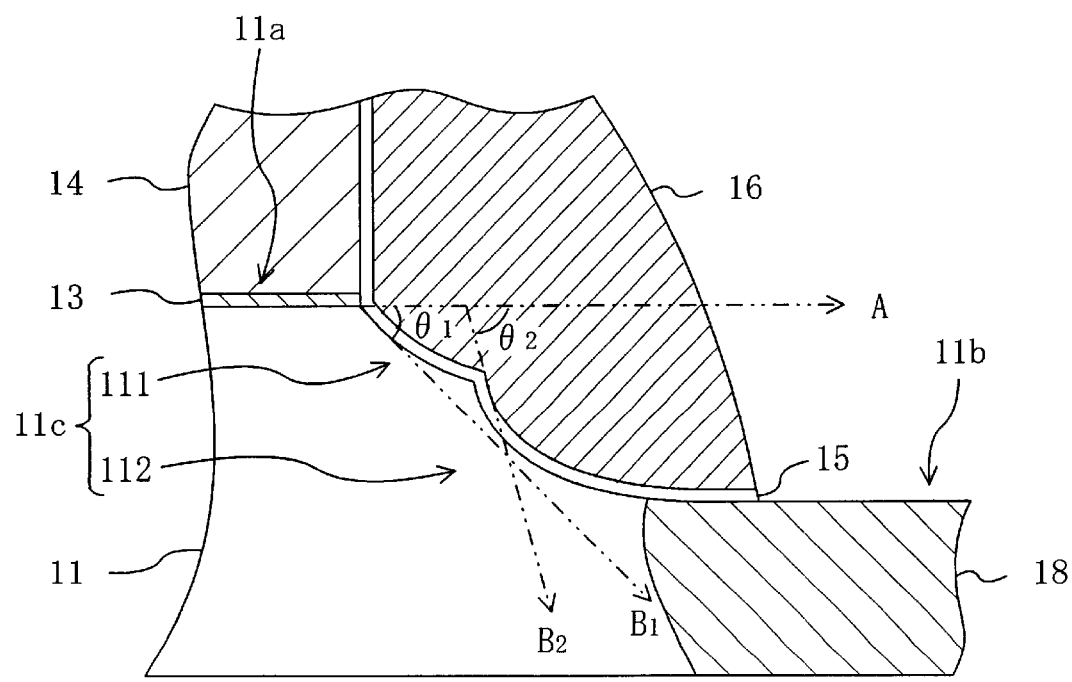

FIGS. 1A and 1B are sectional views of a semiconductor memory device according to the first embodiment. FIG. 1A shows a section of a memory cell, and FIG. 1B shows an enlarged section of the vicinity of a stepped region of the semiconductor substrate.

As shown in FIG. 1A, the semiconductor memory device according to the first embodiment includes a semiconductor substrate 11, a control gate electrode 14, and a floating gate electrode 16. The semiconductor substrate 11 is of silicon (Si), for example, and partitioned into element active regions by selectively formed, element isolation insulating films 12 of silicon oxide. The control gate electrode 14 is of polysilicon and selectively formed on the semiconductor substrate 11 through a first insulating film 13 of silicon oxide ($SiO_2$) to serve as a gate insulating film. The floating gate electrode 16 is of polysilicon and formed on one side surface of the control gate electrode 14 and on the semiconductor substrate 11 through a second insulating film 15 of silicon oxide. Here, the portion of the second insulating film 15 opposed to the control gate electrode 14 serves as a capacitive film, while the portion opposed to the channel region of the semiconductor substrate 11 serves as a tunnel film. The capacitive film portion can be a third insulating film having a different composition from the second insulating film and may be, for example, a capacitive film including silicon nitride.

As shown in FIG. 1B, the semiconductor substrate 11 according to the first embodiment includes a first main surface 11a, a second main surface 11b, and a stepped region 11c. The first main surface 11a has the control gate electrode 14 and a source region 17 formed thereunder, and the second main surface 11b is positioned at a lower level than the first main surface 11a and has a drain region 18 formed thereunder. The stepped region 11c connects the first and second main surfaces 11a and 11b and is covered with the floating gate electrode 16.

According to the first embodiment, the stepped region 11c includes a first stepped portion 111 connected with the first main surface 11a and a second stepped portion 112 connecting the first stepped portion 111 and the second main surface 11b.

As shown in FIG. 1B, with respect to the upper side corner of the first stepped portion 111 as the initial point, the first dip angle (first inclination) $\theta_1$ made between the first main surface direction A and the slant direction $B_1$ of the first stepped portion 111 is an acute angle. Similarly, the second dip angle (second inclination) $\theta_2$ made between the first main surface direction A and the direction $B_2$ of the slant of the second stepped portion 112 at the upper side corner of the second stepped portion 112 is an acute angle.

Here, the second dip angle $\theta_2$ is preferably larger than the first dip angle $\theta_1$, and the first dip angle $\theta_1$ is preferably larger than 0° and substantially not larger than 50°. This is because at the time of etching the semiconductor substrate 11 to form the stepped portions 111 and 112, the first stepped portion 111 formed first is at a shallower level. More specifically, if the first dip angle $\theta_1$ is not larger than 50° and the second dip angle $\theta_2$ is larger than the first dip angle $\theta_1$, the second insulating film 15 can more effectively be prevented from being locally thinned than otherwise.

Note that if the stepped region 11c includes only the first stepped portion 111, a prescribed necessary depth (height) cannot be secured for the stepped region, and the stepped region 11c cannot improve the efficiency of hot electron injection as sufficiently as intended during writing operation to the floating gate electrode 16.

As described above, according to the first embodiment, the stepped region 11c covered by the floating gate electrode 16 includes the first and second stepped portions 111 and 112 and therefore the depth of stepped portions 111 and 112 is both small. As a result, the respective dip angles $\theta_1$ and $\theta_2$ at the upper corners of the stepped portions 111 and 112 are both an acute angle. Thus, the second insulating film 15 serving as a tunnel film to cover the stepped region 11c is not locally thinned at the corners of the stepped portions 111 and 112. Therefore, the breakdown voltage of the second insulating film 15 is not lowered and the semiconductor memory device may have improved reliability.

A method of manufacturing the semiconductor memory device as described above will be now described in conjunction with the accompanying drawings.

FIGS. 2A to 2C and FIGS. 3A to 3C are sectional views showing the method of manufacturing the semiconductor memory device according to the first embodiment of the invention in the order of steps.

Figure 2A:
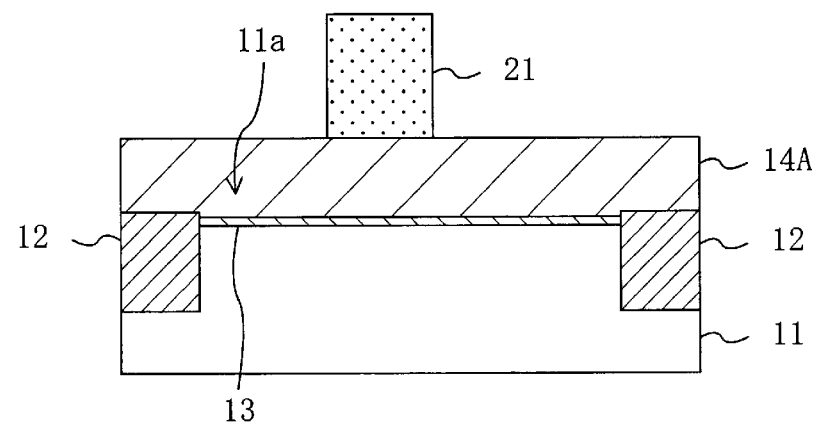
FIGS. 2A to 2C are sectional views showing a method of manufacturing a semiconductor memory device according to the first embodiment of the present invention in the order of steps.

As shown in FIG. 2A, a groove (trench) about as deep as 300 nm is selectively formed on the first main surface 11a of the semiconductor substrate 11. The groove is filled with silicon oxide to form an element isolation insulating film 12. Then, by thermal oxidation, a first insulating film 13 of silicon oxide having a thickness of about 10 nm is formed on the first main surface 11a. Then, a control gate forming film 14A of polysilicon having a thickness of about 200 nm is formed on the first insulating film 13 by reduced pressure CVD (Chemical Vapor Deposition). The control gate forming film 14A is implanted with phosphorus (P) ions at an acceleration voltage of about 10 KeV and with a dose of about $2 \times 10^{15}$ cm$^{-2}$, followed by annealing for about 15 minutes in a nitrogen atmosphere at a temperature of about 800° C. Thus, the control gate forming film 14A is provided with conductivity. Then, a first mask pattern 21 having an electrode pattern is formed on the control gate forming film 14A by lithography. Note that the control gate forming film 14A may be deposited in a conductive state rather than being implanted with n-type impurity ions after the deposition.

Figure 2B:
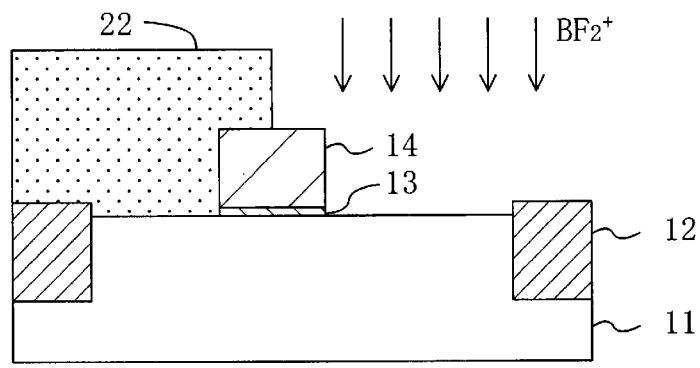

Then, as shown in FIG. 2B, the control gate forming film 14A is anisotropically dry-etched using the first mask pattern 21. Thus, a control gate electrode 14 is formed from the control gate forming film 14A. Using the first mask pattern 21 and the control gate electrode 14 as masks, the first insulating film 13 to be a gate insulating film is patterned. The first mask pattern 21 is then removed, and a second mask pattern 22 to cover the source forming region and the source forming region side of the control gate electrode 14 in the element active region is formed by lithography. Then, using the second mask pattern 22 and the control gate electrode 14 as masks, boron fluoride ions (BF$_2$+) for forming a channel region are implanted under the floating gate forming region of the semiconductor substrate 11 at an acceleration voltage of about 20 KeV and with a dose of about $1 \times 10^{13}$ cm$^{-2}$. The second mask pattern 22 is then removed.

Figure 2C:
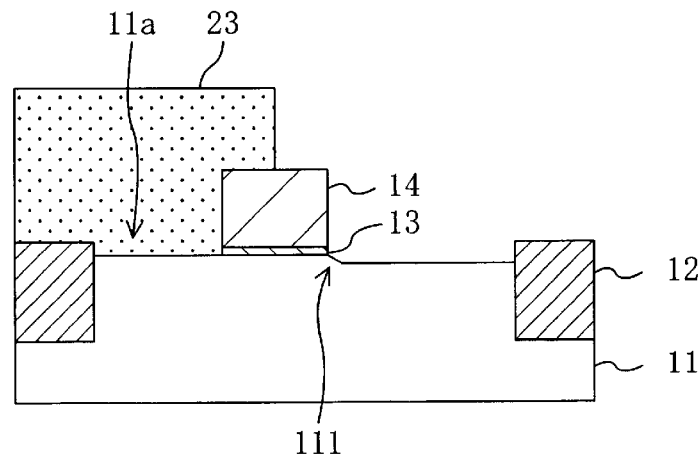

As shown in FIG. 2C, a third mask pattern 23 the same as the second mask pattern 22 is formed. Using the third mask pattern 23 and the control gate electrode 14 as masks, anisotropic dry etching is performed to the floating gate forming region and the side of the drain forming region in the element active region for about 15 seconds. The etching is performed using a mixture gas of CHF$_3$ and O$_2$ as an etching gas and, for example, at a pressure of about 5 Pa and an RF power value of about 250 W. As a result, a first stepped portion 111 as deep as about 5 nm is formed. At the time, the flow rate of the CHF$_3$ is about 50 ml/min, while the flow rate of the O$_2$ is about 12 ml/min. Then, the third mask pattern 23 is removed.

Figure 3A:
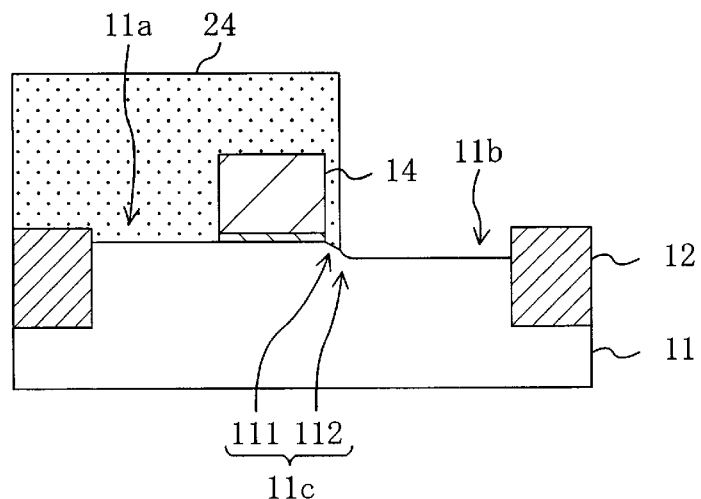
FIGS. 3A to 3C are sectional views showing the method of manufacturing a semiconductor memory device according to the first embodiment of the present invention in the order of steps.

Then, as shown in FIG. 3A, a fourth mask pattern 24 is formed by lithography. In the pattern, an opening is formed on the side of the first stepped portion 111 in the element active region, and the opening end is positioned on the slant of the first stepped portion 111. Then, using the fourth mask pattern 24 as a mask, a region connected to the first stepped portion 111 in the element active region is isotropically dry-etched. The etching process is performed for about 15 seconds using a mixture gas of CF$_4$ and O$_2$ as an etching gas and, for example, at a pressure of about 300 Pa and an RF power value of about 300 W. A second stepped portion 112 about as deep as 20 nm is thus formed. Thus, the second stepped portion 112 connected to the first stepped portion 111, and a second main surface 11b connected to the second stepped portion 112 are formed. At the time, the flow rate of the CF$_4$ is about 100 ml/min while the flow rate of the O$_2$ is 10 ml/min.

Figure 3B:
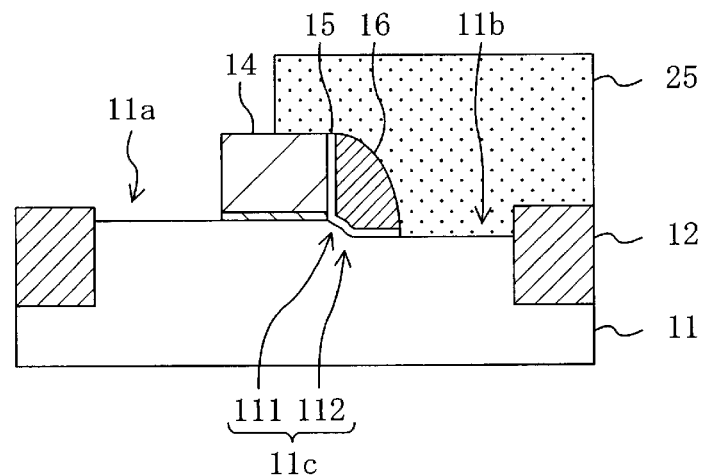

As shown in FIG. 3B, after the removal of the fourth mask pattern 24, a second insulating film 15 of silicon oxide about as thick as 10 nm is formed by thermal oxidation entirely on the first main surface 11a, the upper and side surfaces of the control gate electrode 14, the stepped region 11c and the second main surface 11b. Then, a floating gate forming film of polysilicon about as thick as 300 nm is deposited on the second insulating film 15 by reduced pressure CVD. Then, the floating gate forming film may be implanted with ions and provided with conductivity. Subsequently, the floating gate forming film is anisotropically etched back, so that the floating gate forming film is formed into sidewalls remaining on both side surfaces of the control gate electrode 14.

Subsequently, a fifth mask pattern 25 having an opening on the first main surface 11a and a floating gate electrode pattern is formed. Using the fifth mask pattern 25, the sidewall-shaped floating gate film is etched. As a result, a floating gate electrode 16 capacitively coupled with the control gate electrode 14 through the second insulating film 15 and opposed to the stepped region 11c (channel region) using the second insulating film 15 as a tunnel film is formed.

Figure 3C:
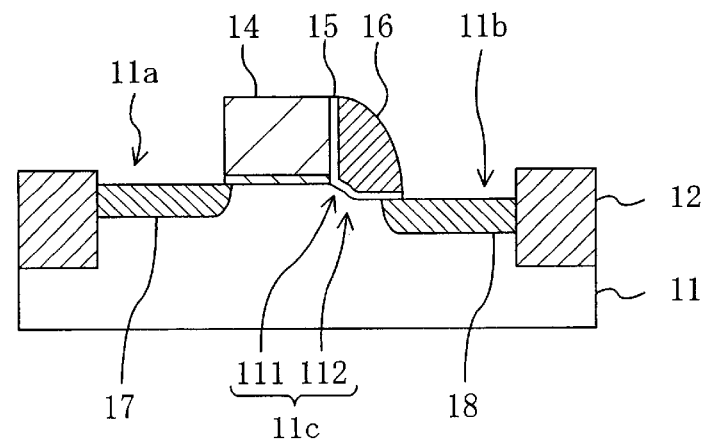

As shown in FIG. 3C, after the removal of the fifth mask pattern 25, using the control gate electrode 14 and the floating gate electrode 16 as masks, the first and second main surfaces 11a and 11b of the semiconductor substrate 11 are implanted with phosphorus ions, for example, and thermally treated at a temperature of about 850° C. As a result, a source region 17 and a drain region 18 are formed under the first and second main surfaces 11a and 11b, respectively.

Subsequently, though not shown, the steps of forming necessary interconnections, forming a protection film, dicing, bonding and the like follow and the device is finished into a product.

As in the foregoing, by the manufacturing method according the first embodiment, the floating gate electrode 16 covers the stepped region 11c for increasing the carrier injection efficiency. The stepped region 11c is formed by two relatively shallow etching steps, so that the second insulating film 15 as the tunnel film covering the stepped region 11c can be prevented from being locally thinned at the corners of the stepped portions 111 and 112. As a result, the breakdown voltage of the second insulating film 15 is not lowered, so that the semiconductor memory device may have improved reliability.

[Second Embodiment]

A second embodiment of the present invention will be now described in conjunction with the accompanying drawings.

FIGS. 4A to 4C and FIGS. 5A and 5B are sectional views showing a method of manufacturing a semiconductor memory device according to the second embodiment. Here, the same elements as those in the first embodiment are denoted by the same reference characters.

Figure 4A:
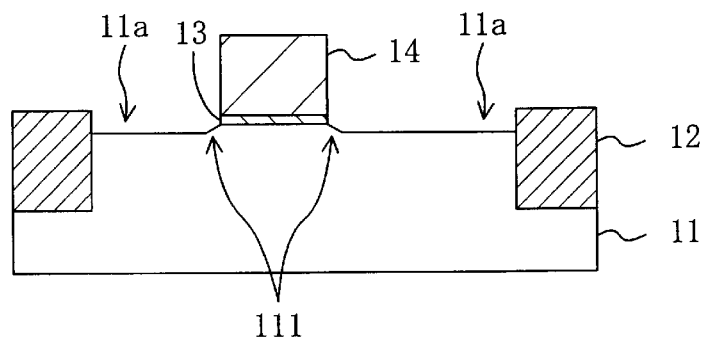
FIGS. 4A to 4C are sectional views showing a method of manufacturing a semiconductor memory device according to a second embodiment of the present invention in the order of steps.

Similarly to the first embodiment, an element active region partitioned by element isolation insulating films 12 is formed on a semiconductor substrate 11. Then, a first insulating film 13 and a control gate electrode 14 thereon are formed on the element active region by patterning including lithography and etching. Then, as shown in FIG. 4A, using the control gate electrode 14 as a mask, the element active region is anisotropically dry-etched. The etching is performed using a mixture gas of $CHF_3$ and $O_2$ as an etching gas for about 15 seconds at a pressure of about 5 Pa and an RF power value of about 250 W. Thus, a first stepped portion 111 about as deep as 5 nm is formed in a self-aligned manner on the side of the control gate electrode 14 in the element active region. As a result, according to the second embodiment, the lower step of the first stepped portion 111 forms the first main surface 11a. Note that the flow rate of the $CHF_3$ is about 50 ml/min while the flow rate of the $O_2$ is about 12 ml/min.

Figure 4B:
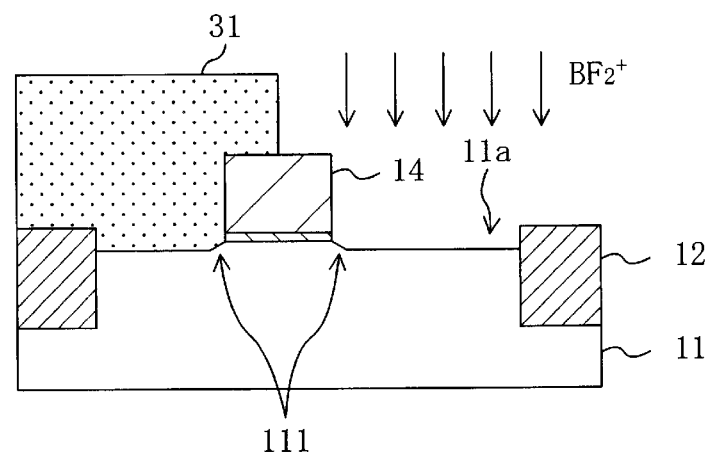

Then, as shown in FIG. 4B, a first mask pattern 31 to cover the source forming region and the control gate electrode 14 on the side of the source forming region in the element active region is formed by lithography. Using the first mask pattern 31 and the control gate electrode 14 as masks, boron fluoride ($BF_2+$) ions for forming a channel region are implanted under the floating gate forming region in the semiconductor substrate 11 at an acceleration voltage of about 20 KeV and with a dose of about $1\times10^{13}$ $cm^{-2}$. Then, the first mask pattern 31 is removed.

Figure 4C:
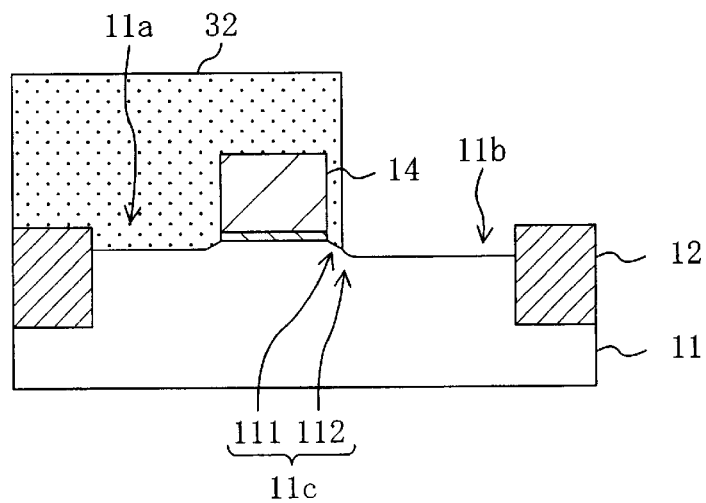

As shown in FIG. 4C, a second mask pattern 32 is formed by lithography. In the pattern, an opening is formed on the side of the first stepped portion 111 on the floating gate forming region side in the element active region, and the opening end is positioned on the slant of the first stepped portion 111. Then, using the second mask pattern 32 as a mask, a region connected to the first stepped portion 111 on the side of the floating gate forming region in the element active region is isotropically dry-etched. The etching process is performed for about 15 seconds using a mixture gas of $CF_4$ and $O_2$ as an etching gas at a pressure of about 300 Pa and an RF power value of about 300 W. As a result, a second stepped portion 112 about as deep as 20 nm is formed. Thus, the second stepped portion 112 connected to the first stepped portion 111 and a second main surface 11b connected to the second stepped portion 112 are formed. At the time, the flow rate of the $CF_4$ is about 100 ml/min, while the flow rate of the $O_2$ is about 10 ml/min.

Figure 5A:
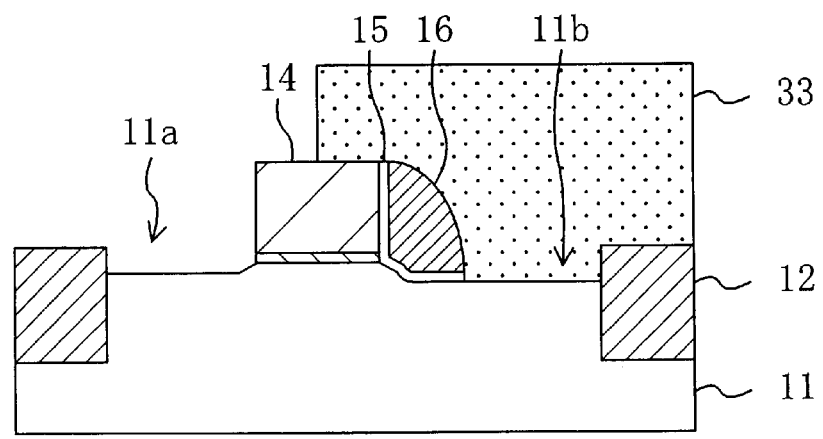
FIGS. 5A and 5B are sectional views showing the method of manufacturing a semiconductor memory device according to the second embodiment of the present invention in the order of steps.

Then, as shown in FIG. 5A, after the removal of the second mask pattern 32, a second insulating film 15 of silicon oxide having a thickness of about 10 nm is formed entirely on the first main surface 11a, the upper and side surfaces of the control gate electrode 14, the stepped region 11c and the second main surface 11b. Subsequently, a floating gate forming film of polysilicon about as thick as 300 nm is deposited by reduced pressure CVD on the second insulating film 15. The floating gate forming film may then be implanted with ions and provided with conductivity. The floating gate forming film is anisotropically etched back, so that the floating gate forming film is formed into sidewalls remaining on both side surfaces of the control gate electrode 14.

Then, a third mask pattern 33 having an opening at the first main surface 11a and floating gate electrode patterns is formed. Then, using the third mask pattern 33, the sidewall-shaped, floating gate forming film is etched to form a floating gate electrode 16. The floating gate electrode 16 is capacitively coupled with the control gate electrode 14 through the second insulating film 15 and is opposed to the stepped region 11c (channel region) using the second insulating film 15 as a tunnel film.

Figure 5B:
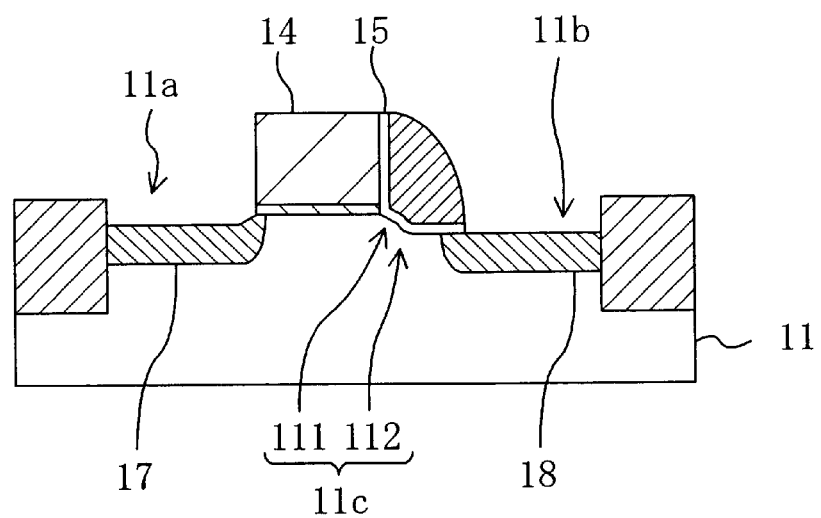
Figure 6A:
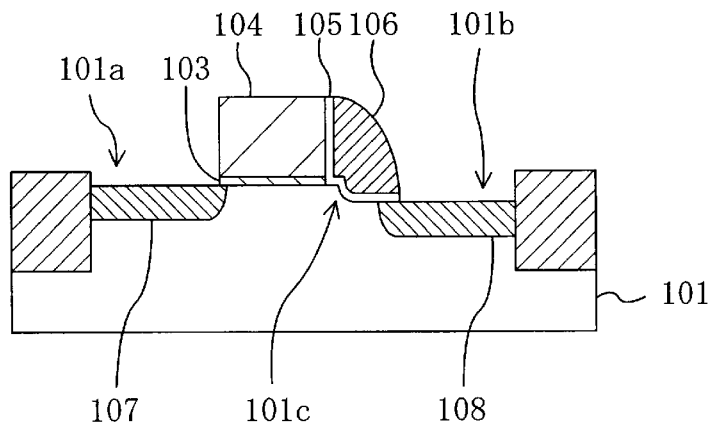
FIGS. 6A and 6B are views of a conventional semiconductor memory device, where
Figure 6B:
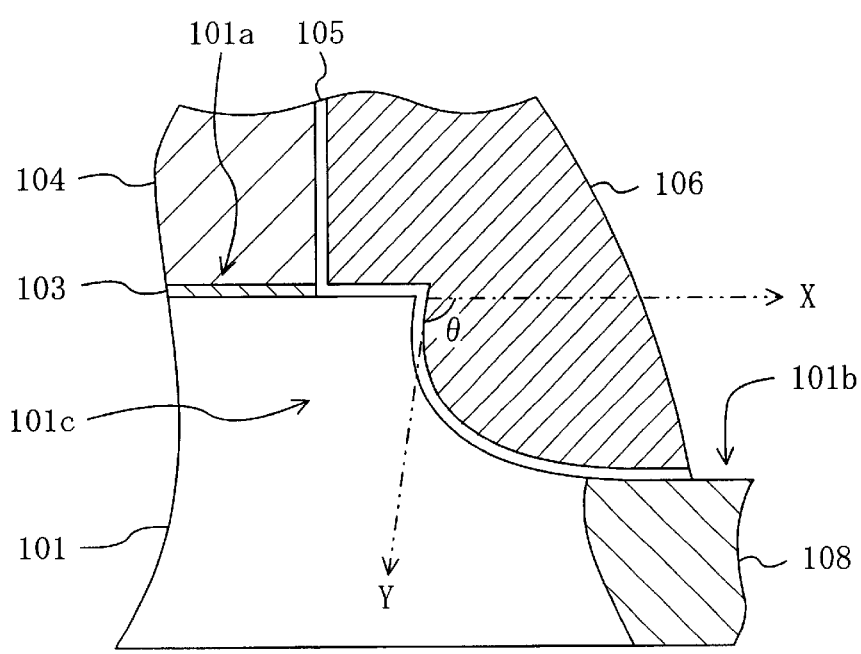

As shown in FIG. 5B, after the removal of the third mask pattern 33, using the control gate electrode 14 and the floating gate electrode 16 as masks, the first and second main surfaces 11a and 11b of the semiconductor substrate 11 are implanted with phosphorus ions, for example, and then thermally treated at a temperature of about 850° C. As a result, a source region 17 and a drain region 18 are formed under the first and second main surfaces 11a and 11b, respectively. Subsequently, though not shown, the steps of forming necessary interconnections, forming a protection film, dicing, bonding and the like follow and the device is finished into a product.

As in the foregoing, by the manufacturing method according the second embodiment, similarly to the first embodiment, the floating gate electrode 16 covers the stepped region 11c for increasing the carrier injection efficiency. The stepped region 11c is formed by two relatively shallow etching steps, so that the second insulating film 15 as the tunnel film covering the stepped region 11c can be prevented from being locally thinned at the corners of the stepped portions 111 and 112. As a result, the breakdown voltage of the second insulating film 15 is not lowered, so that the semiconductor memory device may have improved reliability.

In addition, as shown in FIG. 4B, according to the second embodiment, implantation of boron fluoride ions for controlling a p-type impurity concentration in the channel region is performed after the first stepped portion 111 is formed. This allows the impurity concentration to be readily controlled in the channel region without increasing the number of process steps. As a result, the floating gate type, particularly the split-gate type semiconductor memory device can have higher reliability and performance. Note that the impurity may be implanted into the channel region after the second stepped portion 112 is formed.

Furthermore, according to the second embodiment, the first stepped portion 111 is formed in a self-aligned manner to the control gate electrode 14 without using any resist masks, and therefore the step of masking the first stepped portion 111 can be omitted.

What is claimed is:

1. A semiconductor memory device, comprising:
   a stepped region between a first main surface of a semiconductor substrate and a second main surface of the semiconductor substrate, the second main surface is positioned lower than the first main surface;
   a control gate electrode disposed on the first main surface via a first insulating film;
   a floating gate electrode disposed over the stepped region via a second insulating film and having a side surface capacitively coupled with one side surface of the control gate electrode via a third insulating film;
   wherein the stepped region comprises a plurality of stepped portions.

2. The semiconductor memory device according to claim 1, wherein an angle as defined by a direction of the first main surface and a side surface of each of the stepped portions is an acute dip angle.

3. The semiconductor memory device according to claim 2, wherein the acute dip angle of a lower stepped portion of the plurality of stepped portions is larger than the acute dip angle of an upper stepped portion.

4. The semiconductor memory device according to claim 3, wherein the acute dip angle of the upper stepped portion is larger than 0° and not larger an approximately 50°.

5. A semiconductor memory device, comprising:
   a stepped region between a first main surface of a semiconductor substrate and a second main surface of the semiconductor substrate, the second main surface is positioned lower than the first main surface;
   a control gate electrode disposed on the first main surface via a first insulating film;
   a floating gate electrode disposed over the stepped region via a second insulating film and having a side surface capacitively coupled with one side surface of the control gate electrode via a third insulating film;

wherein the stepped region comprises a first stepped portion and a second stepped portion, wherein the first stepped portion is disposed between the first main surface and the second stepped portion, and wherein the second stepped portion is disposed between the first stepped portion and the second main surface.

6. The semiconductor memory device according to claim 5, wherein an angle as defined by a direction of the first main surface and a side surface of each of the first and second stepped portions is an acute dip angle.

7. The semiconductor memory device according to claim 6, wherein the acute dip angle of the second stepped portion is larger than the acute dip angle of the first stepped portion.

8. The semiconductor memory device according to claim 7, wherein the acute dip angle of the first stepped portion is larger than 0° and not larger than approximately 50°.

* * * * *